(12) United States Patent
Oi

(10) Patent No.: US 8,017,497 B2
(45) Date of Patent: Sep. 13, 2011

(54) METHOD FOR MANUFACTURING SEMICONDUCTOR

(75) Inventor: Hideo Oi, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/687,846

(22) Filed: Jan. 14, 2010

(65) Prior Publication Data

US 2010/0203680 A1   Aug. 12, 2010

(30) Foreign Application Priority Data

Feb. 10, 2009   (JP) ................. 2009-028928

(51) Int. Cl.
*H01L 21/30* (2006.01)
(52) U.S. Cl. .......... 438/455; 438/42; 438/106; 438/459; 257/E21.122; 257/E21.499; 257/E21.575
(58) Field of Classification Search ................ 257/E21.5
See application file for complete search history.

(56) References Cited

U.S. PATENT DOCUMENTS

| | | | |
|---|---|---|---|
| 6,084,284 A | 7/2000 | Adamic | |
| 6,124,179 A | 9/2000 | Adamic | |
| 7,233,048 B2 | 6/2007 | Rybnicek | |
| 2005/0181612 A1 | 8/2005 | Brask et al. | |
| 2006/0075818 A1 | 4/2006 | Huang | |
| 2006/0278980 A1 | 12/2006 | Trezza | |
| 2006/0278981 A1 | 12/2006 | Trezza | |
| 2006/0278993 A1 | 12/2006 | Trezza | |
| 2006/0278994 A1 | 12/2006 | Trezza | |
| 2006/0281243 A1 | 12/2006 | Trezza | |
| 2007/0045820 A1 | 3/2007 | Rybnicek | |
| 2007/0164419 A1 | 7/2007 | Sherrer | |
| 2007/0164443 A1 | 7/2007 | Florian | |
| 2007/0166997 A1 | 7/2007 | Knorr | |
| 2007/0197013 A1 | 8/2007 | Trezza | |
| 2007/0228576 A1 | 10/2007 | Trezza | |

FOREIGN PATENT DOCUMENTS

| | | |
|---|---|---|
| JP | 2007-251145 A | 9/2007 |
| WO | 9422167 A1 | 9/1994 |
| WO | 2007082854 A1 | 7/2007 |

*Primary Examiner* — Walter L Lindsay, Jr.
*Assistant Examiner* — Cheung Lee
(74) *Attorney, Agent, or Firm* — Charles Bergere

(57) ABSTRACT

A method for manufacturing a high quality semiconductor device having a through via structure. A substrate is manufactured with an oxide layer including a window region in a region in which a through via is formed. The substrate is bonded with another substrate to form an SOI substrate. The SOI substrate is ground to reduce its thickness. An island region is formed in a region at which a TSV (Through Silicon Via) structure is formed. A device and a TSV are coupled by a wire. The silicon substrate at a bottom side of the SOI substrate is removed to expose the island region from the bottom. A back contact for the TSV is formed in the window region, which is formed in a buried oxide layer.

4 Claims, 6 Drawing Sheets

METHOD FOR MANUFACTURING SEMICONDUCTOR

BACKGROUND OF THE INVENTION

The present invention relates to a method for manufacturing a semiconductor device having a through via structure.

The die size of semiconductor devices has become smaller. Further, an integrated circuit may have a three-dimensional structure formed by stacking the chips of a semiconductor device. In this case, a structure extending through a silicon substrate, or through silicon via (TSV), is used. The TSV technology allows for stacking of semiconductor devices within a package and couples the semiconductor devices on the top and bottom surfaces. That is, this technology couples chips within a minimum distance, which allows for further sophisticated functions and higher operational speeds.

Japanese Laid-Open Patent Publication No. 2007-251145 (page 1 and FIG. 2) describes one example of a layered package that uses TSV technology. The layered package described in the publication includes a first wire coupled to a bonding pad on a top surface of the layered package, a through silicon via extending through the layered package and coupled to the first wire, and a second wire coupled to the through silicon via on a bottom surface of the layered package. Semiconductor chips are coupled by solder balls.

A process for manufacturing such a TSV structure will now be discussed with reference to FIGS. 5 and 6.

First, referring to FIG. 5A, via holes 101 are formed in predetermined regions of a silicon substrate 10.

Then, as shown in FIG. 5B, an oxide layer 12 is formed on the side walls and bottom walls of each via hole 101. More specifically, the silicon substrate 10 is oxidized to form an oxide film on its surface. Then, a conductive layer 102 is formed on the oxide layer 12 of each via hole 101. In this case, low-pressure chemical vapor deposition (CVD) is performed to deposit a polycrystalline silicon film on the oxide film formed on the silicon substrate 10. Then, the surface of the silicon substrate 10 is etched leaving the oxide film and polycrystalline silicon in each via hole 101. This forms a trench structure including the oxide layer 12 and the conductive layer 102.

Referring to FIG. 5C, a desired device 11 and insulation layers 13 are then formed on the silicon substrate 10 between the via holes 101. The insulation layers 13 are formed to insulate a wiring layer on a chip from the silicon substrate 10. Contact holes are formed in the insulation layers 13, which are arranged on the conductive layers 102.

Referring to FIG. 5D, wiring layers 14 are then formed to couple the device 11 and the conductive layers 102. The wiring layers 14 are coupled to the conductive layers 102 through the contact holes.

Referring to FIG. 5E, a protective layer 15 is then formed on the device 11 and the wiring layers 14. The protective layer 15 is formed to protect the device 11 and the wiring layer 14 in subsequent processes. Phosphosilicate glass (PSG), which is formed through CVD, may be used as the protective layer 15.

Referring to FIG. 6A, the silicon substrate 10 is then ground and polished from the bottom surface. Chemical-mechanical polishing (CMP) may be performed to grind and polish the silicon substrate 10. In this case, the polishing is performed until the conductive layers 102 buried in the via holes 101 are exposed.

Referring to FIG. 6B, an insulation layer 16 is then formed on the bottom side of the silicon substrate 10. Since the device 11 and the wiring layers 14 are formed on the top side of the silicon substrate 10, the insulation layer 16 must be formed through a process that is performed at a relatively low temperature. For example, low-temperature CVD may be performed to form the insulation layer 16.

Referring to FIG. 6C, contact holes 161 are formed in the insulation layer 16 in connection with the conductive layers 102.

Referring to FIG. 6D, electrodes 17, which are coupled to the conductive layers 102 through the contact holes 161, are then formed. As a result, the electrodes 17, which are for the device 11 formed on the top surface of the silicon substrate 10, are formed on the bottom side of the silicon substrate 10.

U.S. Patent Application Publication No. 2007/0164443 (page 1 and FIG. 8) describes one example of a method for manufacturing a semiconductor device using a silicon on insulator (SOI) substrate in which a semiconductor layer is applied to a semiconductor substrate with an insulation layer arranged in between. The method described in the publication forms a device on a top surface of the substrate, forms a through hole in a buried oxide film, and couples the device to a bottom surface of the substrate.

In the prior art, however, when reducing the thickness of the layers on a silicon substrate, it is difficult to control the thickness. Further, the insulation layer formed on the bottom surface of the silicon substrate 10 must be formed using a low-temperature process so that the semiconductor devices and wiring layers are not affected. It is thus difficult to form a high quality insulation layer.

BRIEF DESCRIPTION OF THE DRAWINGS

The invention, together with objects and advantages thereof, may best be understood by reference to the following description of the presently preferred embodiments together with the accompanying drawings in which:

FIG. 2 illustrates procedures for manufacturing the semiconductor device of FIG. 1, where

FIG. 3 illustrates a process for fabrication the semiconductor device of FIG. 1, where

FIG. 4 illustrates a process for fabricating a semiconductor device according to another embodiment of the present invention, where

FIG. 5 illustrates a conventional process for fabricating a semiconductor device, where FIG. 6 illustrates a conventional process for fabricating a semiconductor device in accordance with another conventional method, in which

DETAILED DESCRIPTION OF THE PREFERRED EMBODIMENTS

The present invention provides a method for efficiently manufacturing a high-quality semiconductor device having a through via structure.

One aspect of the present invention is a method for manufacturing a semiconductor device. The method includes bonding a first substrate, which includes a first insulation layer having an opening, and a second substrate with the insulation layer arranged in between to form a layered substrate. The method further includes forming a second insulation layer extending to the first insulation layer in the first substrate around a region connected to the opening, forming a device on the first substrate, and etching the second substrate to expose the first insulation layer and the opening and forming a bottom electrode coupled to the device through the opening.

Other aspects and advantages of the present invention will become apparent from the following description, taken in conjunction with the accompanying drawings, illustrating by way of example the principles of the invention.

Figure 1:
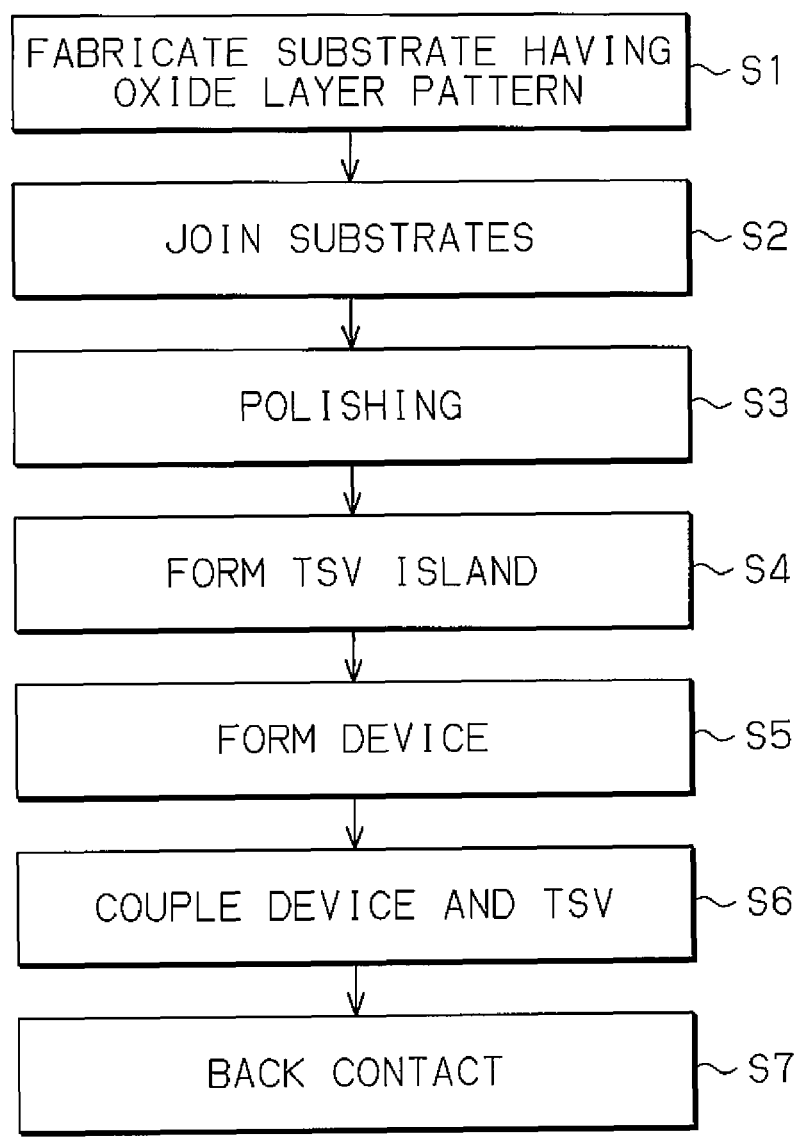
FIG. 1 is a flowchart showing a method for manufacturing a semiconductor device according to one embodiment of the present invention.

An electronic device according to one embodiment of the present invention will now be discussed with reference to FIGS. 1 to 3. A method for manufacturing a structure including an electrode formed on a bottom surface of a silicon substrate on which a semiconductor device is formed will be described hereafter. The process for fabricating the semiconductor device will be described with reference to FIG. 1. A cross-sectional view of the structure described in each step will be described with reference to FIGS. 2 and 3. In this embodiment, silicon substrates 20 and 21 of which silicon planes have a crystalline orientation of the [100] face are used.

Figure 2A:
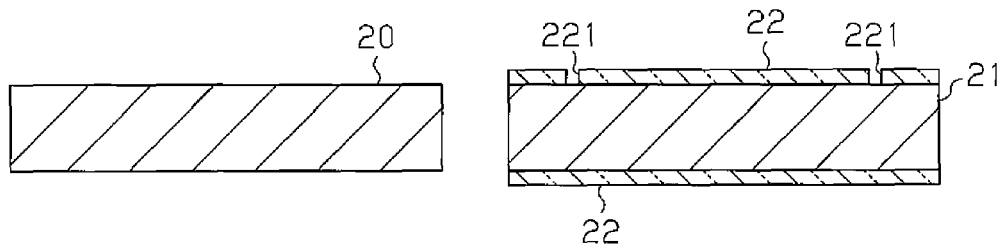
FIG. 2A is a diagram showing two silicon substrates used to form an SOI substrate.

First, a substrate having an oxide layer pattern is used (step S1). More specifically, as shown in FIG. 2A, a silicon substrate 21 (first substrate) having an oxide layer 22, which serves as a first insulation layer, is prepared. The oxide layer 22 is an oxide film formed by oxidizing a silicon substrate. Window regions 221, which serve as openings, are formed beforehand in the oxide layer 22. The window regions 221 are formed at regions in which through vias are formed in subsequent processes. Further, a normal silicon substrate 20 is prepared as a second substrate.

Figure 2B:
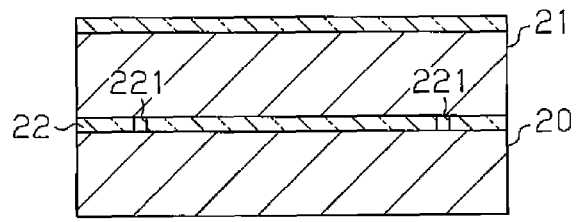
FIG. 2B is a diagram showing the SOI substrate with window regions.

Then, substrate bonding is performed (step S2). More specifically, as shown in FIG. 2B, a direct bonding technique is used to bond the oxide layer 22 and the silicon substrate 20. That is, the oxide layer 22, which includes the window regions 221, is superimposed with the silicon substrate 20 and heated to produce an SOI substrate, which serves as a layered substrate. As shown in FIG. 2B, the surface of the silicon substrate 21 on which the window regions 221 are formed faces downward when bonding the silicon substrate 21 with the silicon substrate 20.

Figure 2C:
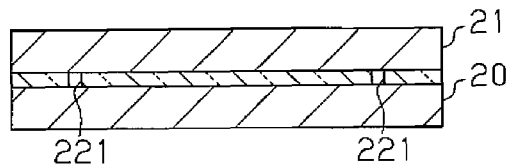
FIG. 2C is a diagram showing the SOI substrate of which thickness has been reduced.

Substrate polishing is then performed (step S3). More specifically, as shown in FIG. 2C, the two surfaces of the SOI substrate are polished to reduce the thickness of the silicon substrates 20 and 21.

Figure 2D:
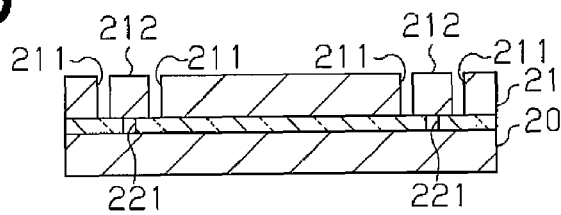
FIG. 2D is a diagram showing the formation of island regions.

Then, TSV islands are formed (step S4). More specifically, as shown in FIG. 2D, via holes 211, which reach the oxide layer 22, are formed around a predetermined region of the silicon substrate 21, the thickness of which has been reduced. Light transmitted through the silicon substrate 21 (e.g., infrared light) is used to specify the window regions 221 when forming the via holes 211. This forms island regions 212, which are surrounded by the via holes 211.

Figure 2E:
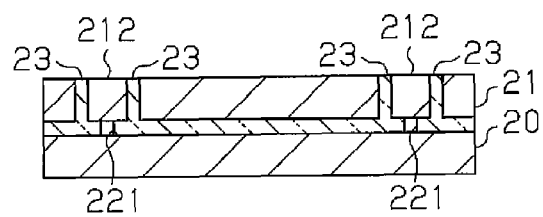
FIG. 2E is a diagram showing the insulation of the island regions.

Further, as shown in FIG. 2E, the via holes 211 are filled with an oxide layer to form an insulation layer 23, which serves as a second insulation layer. This covers the side surfaces and bottom surfaces of the island regions 212 (excluding the window regions 221) with insulation layers.

Figure 3A:
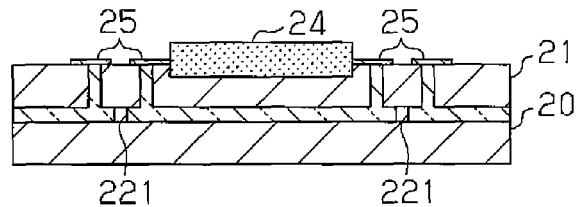
FIG. 3A is a diagram showing the formation of a device.

Then, a device is formed (step S5). More specifically, as shown in FIG. 3A, a device 24, which is surrounded by the island regions 212, and an insulation layer 25 are formed on the silicon substrate 21. The insulation layer 25 is used to isolate a wiring layer, which is coupled to the device 24, from the silicon substrate 21. Further, contact holes, which are connected to the island regions 212, are formed in the insulation layer 25.

Figure 3B:
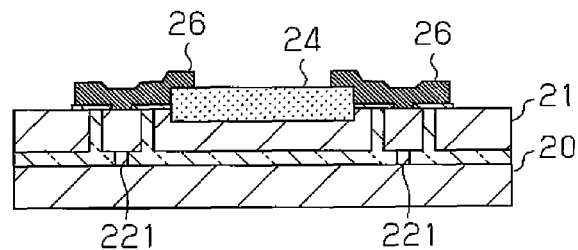
FIG. 3B is a diagram showing the formation of wires.

Then, the device and TSVs are coupled (step S6). More specifically, as shown in FIG. 3B, a wiring layer 26 is used to couple the device 24 and the island regions 212.

Figure 3C:
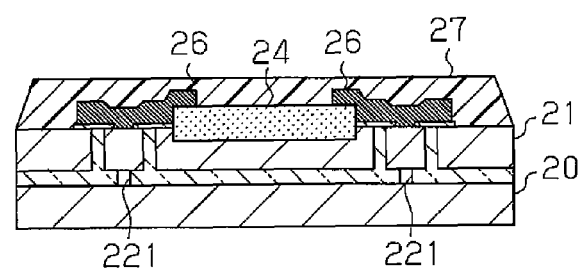
FIG. 3C is a diagram showing the formation of a protective layer.

Then, a back contact is formed (step S7). More specifically, as shown in FIG. 3C, a protective layer 27 is formed to protect the device 24 and the wiring layer 26.

Figure 3D:
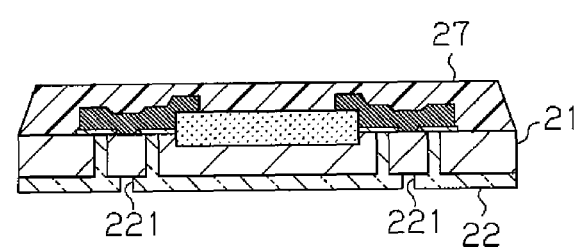
FIG. 3D is a diagram showing the removal of the bottom silicon substrate.

Then, as shown in FIG. 3D, the bottom silicon substrate 20 undergoes grinding and polishing until the oxide layer 22 is reached. In this embodiment, an anisotropic etching solution is used to process silicon material. Further, in this embodiment, tetramethyl-ammonium-hydroxide (TMAH) is used. In a silicon crystal, the TMAH subtly etches a [111] face of a silicon crystal but etches a [100] face at an etching speed of approximately 9000 µm/min. Further, the etching speed with respect to an oxide film is low, and the etching selectivity of approximately 5000 is obtained for a [100] face. Accordingly, an oxide film may be used as an etching stopper. In this case, the window regions 221 formed in the oxide layer 22 are exposed.

Figure 3E:
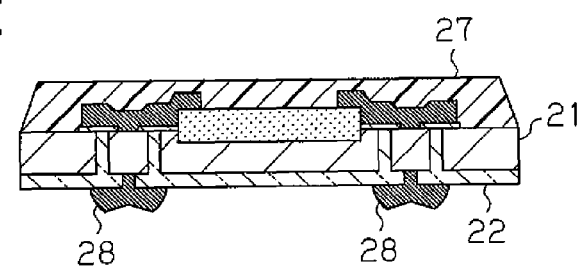
FIG. 3E is a diagram showing the formation of bottom electrodes.

As shown in FIG. 3E, electrodes 28 are then formed. The electrodes 28 are coupled to the island regions 212 through the window regions 221. Here, selective growth for metal (conductive material) is performed using as a species the island regions 212 exposed from the lower surface of the silicon substrate 21. The selective growth ends when pad regions having a predetermined size are formed on the oxide layer 22. This forms the electrodes 28 (bottom electrodes).

The device structure of this embodiment has the advantages described below.

In the above-described embodiment, the device 24 is formed on a substrate having the buried oxide layer 22. The silicon substrate 20 on the bottom side is then ground and polished until the silicon substrate 20 is reached. In this case, selective etching is performed on semiconductor material and insulation material to accurately stop the grinding and polishing of the bottom silicon substrate 20.

In the above-described embodiment, the silicon substrate 21 including the oxide layer 22 is prepared. The oxide layer 22 includes the window regions 221 which are formed beforehand. The window regions 221 are used to form through vias in a subsequent process. Thus, in a bottom side process, there is no need to perform mask alignment when forming a contact hole pattern, and a TSV structure may be formed with the window regions 221.

In the above-described embodiment, the buried oxide layer 22 may be used as a bottom insulation layer for a silicon substrate on which the device 24 is formed. Subsequent to device formation, processing conditions, such as the temperature, are restricted. Thus, although the formation of a high quality insulation layer may be difficult, the use of the preformed oxide layer 22 obtains satisfactory insulation.

It should be apparent to those skilled in the art that the present invention may be embodied in many other specific forms without departing from the spirit or scope of the invention. Particularly, it should be understood that the present invention may be embodied in the following forms.

In the above-described embodiment, a normal silicon substrate 20 is used at the bottom side of an SOI substrate. The silicon substrate 20 is ultimately ground and polished. Thus, there is no need to use a monocrystalline substrate, and, for example, a polycrystalline substrate may be used.

In the above-described embodiment, the silicon material of the island regions 212 is used to couple the wiring layer 26, which is on the top side, with the electrodes 28, which is on the bottom side. However, the material that extends through the silicon substrate is not limited in such a manner, and a metal material may be used for the coupling. Such a manufacturing process will now be discussed with reference to FIG. 4.

Figure 4A:
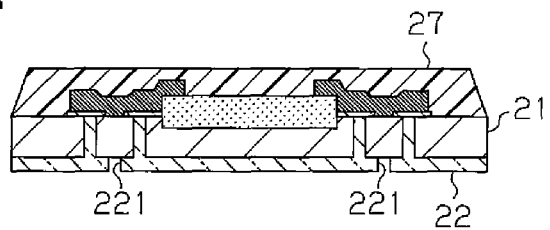
FIG. 4A is a diagram showing the removal of a bottom silicon substrate.
Figure 4B:
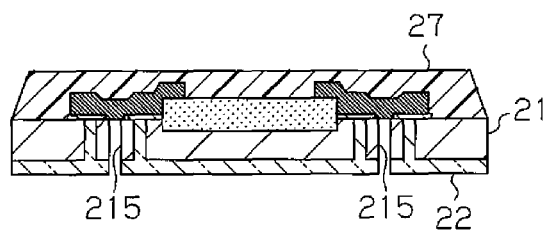
FIG. 4B is a diagram showing the formation of through holes.

As shown in FIG. 4A, polishing is performed until the bottom oxide layer 22 becomes exposed. Then, as shown in FIG. 4B, through holes 215 are formed in the window regions 221. Selective etching may be performed on the silicon substrate using the oxide layer 22 as a mask. The through holes 215 are formed extending to the wiring layer 26. The through holes 215 do not necessarily have to extend to the wiring layer 26 as long as they reach the vicinity of the wiring layer 26.

When forming the through holes 215, directive etching for silicon is performed using an ion stream. Further, by using a solution that does not etch insulation material (oxide layer 22 and insulation layer 23) and metal material (wiring layer 26), only silicon material may be selectively etched.

Further, during the etching, there is no need to leave silicon material on the side walls of the through holes 215, and the insulation layer 23 may be exposed.

Figure 4C:
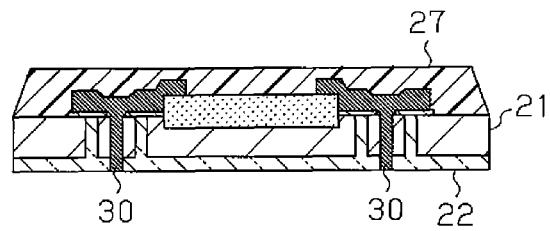
FIG. 4C is a diagram showing the through holes filled with metal.

Then, as shown in FIG. 4C, the through holes 215 are filled with a metal layer 30. Here, metal selective growth is performed using the wiring layer 26 as a core.

Figure 4D:
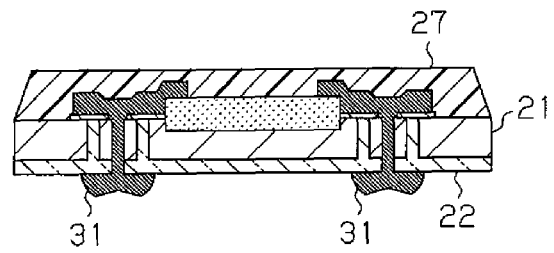
FIG. 4D is a diagram showing the formation of bottom electrodes.
Figure 5A:
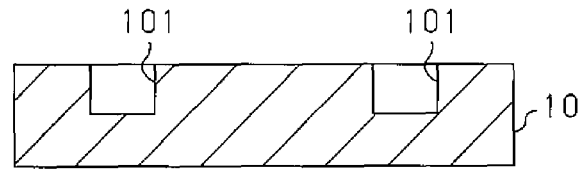
FIG. 5A is a diagram showing the formation of trenches.
Figure 5B:
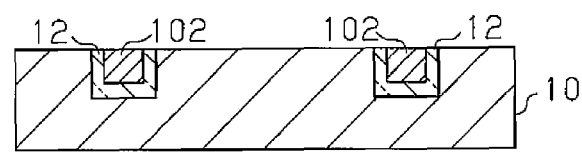
FIG. 5B is a diagram showing the filling of the trenches.
Figure 5C:
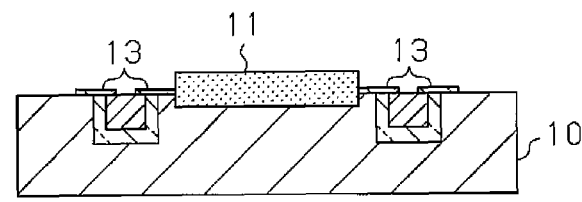
FIG. 5C is a diagram showing the formation of a device.
Figure 5D:
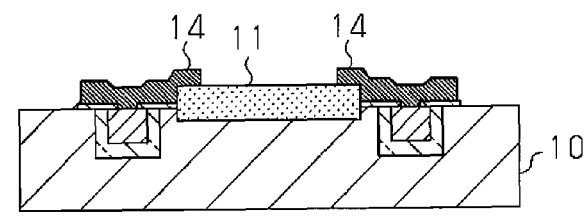
FIG. 5D is a diagram showing the formation of wires.
Figure 5E:
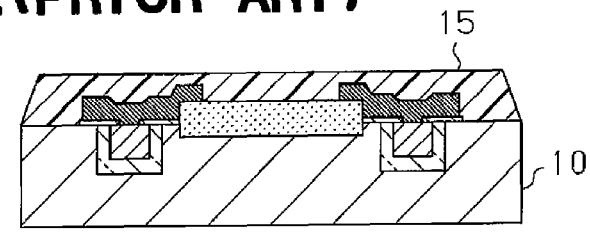
FIG. 5E is a diagram showing the formation of a protective layer.
Figure 6A:
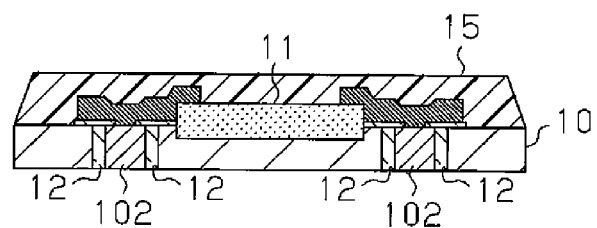
FIG. 6A is a diagram showing the removal of a silicon substrate from the bottom side.
Figure 6B:
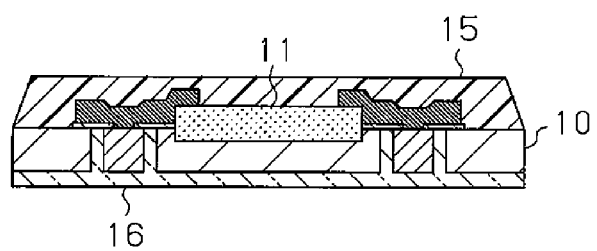
FIG. 6B is a diagram showing the formation of a bottom insulation layer.
Figure 6C:
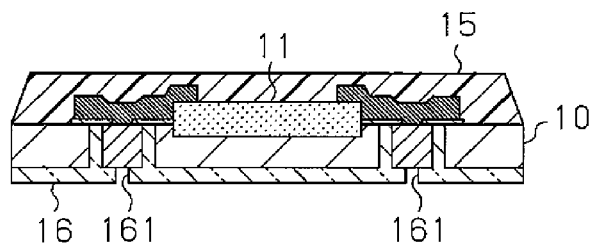
FIG. 6C is a diagram showing the formation of contact holes.
Figure 6D:
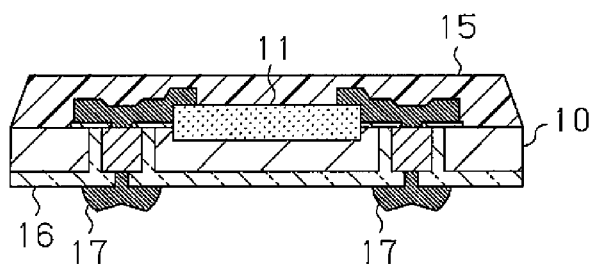
FIG. 6D is a diagram showing the formation of bottom electrodes.

As shown in FIG. 4D, electrode layers 31 are formed coupled to the metal layer 30. This obtains a TSV structure having a lower resistance and thereby allows for improvement in the device capacity.

In the above-described embodiment, TMAH is used as an anisotropic etching liquid. However, the etching liquid is not limited to TMAH. For example, KOH may be used as the etching liquid. The oxide film is also used as an etching stopper in this case.

The present examples and embodiments are to be considered as illustrative and not restrictive, and the invention is not to be limited to the details given herein, but may be modified within the scope and equivalence of the appended claims.

What is claimed is:

1. A method for manufacturing a semiconductor device, the method comprising:
    bonding a first substrate, which includes a first insulation layer having an opening, and a second substrate, wherein the insulation layer is arranged between the first and second substrates, to form a layered substrate;
    forming a via in the first substrate, wherein the via extends to the first insulation layer;
    forming a second insulation layer that extends by way of the via to the first insulation layer in the first substrate around a region connected to the opening;
    forming a device on the first substrate;
    etching the second substrate to expose the first insulation layer and the opening; and
    forming a bottom electrode that is coupled to the device through the opening.

2. The method according to claim 1, wherein the first insulation layer is an oxide layer.

3. The method according to claim 1, wherein the bottom electrode is formed by performing selective growth of conductive material on the first substrate exposed through the opening.

4. The method according to claim 1, wherein the second substrate is etched through an etching process of which speed for etching the material of the substrate is slower than the speed for etching the first insulation layer.

* * * * *